United States Patent

Yamano

(10) Patent No.: US 11,929,252 B2
(45) Date of Patent: Mar. 12, 2024

(54) GALLIUM OXIDE-BASED SEMICONDUCTOR AND PRODUCTION METHOD THEREOF

(71) Applicant: TOYOTA JIDOSHA KABUSHIKI KAISHA, Toyota (JP)

(72) Inventor: Hayate Yamano, Susono (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 452 days.

(21) Appl. No.: 17/221,881

(22) Filed: Apr. 5, 2021

(65) Prior Publication Data

US 2021/0335608 A1 Oct. 28, 2021

(30) Foreign Application Priority Data

Apr. 24, 2020 (JP) ................. 2020-077639

(51) Int. Cl.
*H01L 21/02* (2006.01)
*C23C 14/08* (2006.01)
(Continued)

(52) U.S. Cl.
CPC .. *H01L 21/02565* (2013.01); *H01L 21/02595* (2013.01); *H01L 21/02631* (2013.01); *H01L 29/24* (2013.01)

(58) Field of Classification Search
CPC ......... H01L 21/02565; H01L 21/02595; H01L 21/02631; H01L 29/24; C30B 29/16; C30B 25/02
See application file for complete search history.

(56) References Cited

U.S. PATENT DOCUMENTS 8,193,020 B2* 6/2012 Keller ................. H01L 21/0242
438/483
2019/0157400 A1* 5/2019 Tanikawa .............. H01L 29/786
(Continued)

FOREIGN PATENT DOCUMENTS

CN 109411328 A 3/2019
KR 1020150032279 A 3/2015

OTHER PUBLICATIONS

Huang et al., "High-insulating β-$Ga_2O_3$ thin films by doping with a valence controllable Fe element," Applied PhysicsA, (2018)124:611.
(Continued)

*Primary Examiner* — Mohsen Ahmadi
(74) *Attorney, Agent, or Firm* — Dickinson Wright, PLLC

(57) ABSTRACT

To provide a gallium oxide-based semiconductor with its bandgap being sufficiently reduced, and a manufacturing method thereof.
A gallium oxide-based semiconductor containing a mixed crystal having a composition represented by $(Ga_{(1-x)}Fe_x)_{2y}O_3$, wherein $0.10 \leq x \leq 0.40$ and $0.85 \leq y \leq 1.2$, wherein the mixed crystal has a beta-gallia structure, is provided. Also, a method for manufacturing the gallium oxide-based semiconductor, including depositing a mixed crystal having a composition represented by $(Ga_{(1-x)}Fe_x)_{2y}O_3$, wherein $0.10 \leq x \leq 0.40$ and $0.85 \leq y \leq 1.2$ on a substrate surface by a pulsed laser deposition method, wherein denoting the temperature of the substrate as T° C., x and T satisfy the relationship represented by $500x+800 \leq T<1,000$, is provided.

3 Claims, 9 Drawing Sheets

(51) Int. Cl.
    *C23C 14/28*    (2006.01)
    *H01L 27/12*    (2006.01)
    *H01L 29/24*    (2006.01)
    *H01L 29/786*   (2006.01)

(56) References Cited

U.S. PATENT DOCUMENTS

2019/0189441 A1* 6/2019 Fujita .................. H01L 29/7787
2019/0267450 A1* 8/2019 Oshima ............... H01L 21/0228
2020/0388684 A1* 12/2020 Sugimoto ......... H01L 29/66477

OTHER PUBLICATIONS

St. Krehula et al., "Synthesis and microstructural properties of mixed iron-gallium oxides," Journal of Alloys and Compounds Band 634 (2015), pp. 130-141.
B. Srimathy et al., "On the Neel temperature and magnetic domain wall movements of Ga2-xFex03 single crystals grown by floating-zone technique," Journal of Alloys and Compounds Band 590 (2014) pp. 459-464.

* cited by examiner

GALLIUM OXIDE-BASED SEMICONDUCTOR AND PRODUCTION METHOD THEREOF

TECHNICAL FIELD

The present disclosure relates to a gallium oxide-based semiconductor and a production method thereof. More specifically, the present invention relates to a gallium oxide-based semiconductor with its bandgap being reduced, and a production method thereof.

BACKGROUND ART

A semiconductor power device is mounted in a variety of electrical equipment such as home appliances, automobiles, railroad vehicles (electric trains) and industrial equipment and is used as a device for controlling the voltage and/or current. At the time of control of the voltage and/or current, electricity flows through the semiconductor power device. On this occasion, if the electric resistance of the semiconductor power device is large, a loss of electric energy is caused. For example, in the case of an electric vehicle, when a loss of electric energy occurs due to power conversion by the semiconductor power device, the distance that the electric vehicle can travel on a single charge decreases. Accordingly, it is important for the semiconductor power device to decrease the electrical resistance and reduce the loss of electric energy.

As the material for the above-described semiconductor power device, silicon carbide and/or gallium nitride have heretofore been developed and put into practical use. In recent years, gallium oxide is attracting attention as a semiconductor power device material experiencing an even lower loss compared with the materials above.

The gallium oxide includes phases having five types of crystal structures of $\alpha$, $\beta$, $\gamma$, $\delta$ and $\varepsilon$. Of these, a most stable phase is a phase having a p-type crystal structure, i.e., $\beta$-$Ga_2O_3$ phase. The $\beta$-$Ga_2O_3$ phase has a unique monoclinic beta-gallia structure (hereinafter, sometimes simply referred to as "beta-gallia structure").

As the gallium oxide-based semiconductor having a beta-gallia structure, for example, a gallium oxide-based semiconductor having a composition of $(Ga_{(1-x)}Fe_x)_2O_3$ is disclosed in Non-Patent Literature 1. Also, Non-Patent Literature 1 discloses forming the gallium oxide-based semiconductor on a substrate at 750° C. by using a pulsed laser deposition method.

RELATED ART

Non Patent Document

[Non Patent Document 1] Yuanqi Huang, et al, "High-insulating $\beta$-$Ga_2O_3$ thin films by doping with a valence controllable Fe element", Applied Physics, A (2018) 124: 611.

SUMMARY OF INVENTION

Technical Problem

The material for a semiconductor power device is fundamentally required to have a wide bandgap. The gallium oxide-based semiconductor has a wide bandgap, but depending on the type of the semiconductor power device, its application is sometimes difficult, because the bandgap is too wide. Accordingly, in some cases, it is intended to reduce the bandgap of the gallium oxide-based semiconductor.

Replacing part of gallium in gallium oxide with iron is known to be effective for reducing the bandgap of the gallium oxide-based semiconductor. However, if the replacement ratio to iron is high, the beta-gallia structure can hardly be maintained. When the beta-gallia structure in the gallium oxide-based semiconductor is damaged, the electrical conductivity, withstand voltage, stability and production yield of a device using the gallium oxide-based semiconductor are impaired. For this reason, as in the gallium oxide-based semiconductor described in Non Patent Document 1, what can be done is only to add a small amount of iron as a dopant to gallium oxide, and the bandgap cannot be sufficiently reduced.

From these, the present inventors have found a problem that a gallium oxide-based semiconductor with its bandgap being sufficiently reduced and a production method thereof are desired.

The present disclosure has been made to solve the problem above. More specifically, an object of the present disclosure is to provide a gallium oxide-based semiconductor with its bandgap being sufficiently reduced and a production method thereof.

Solution to Problem

The present inventors have made many intensive studies so as to attain the object above and have accomplished the gallium oxide-based semiconductor of the present disclosure and a production method thereof. The gallium oxide-based semiconductor of the present disclosure and a production method thereof include the following embodiments.

<1> A gallium oxide-based semiconductor comprising a mixed crystal having a composition represented by $(Ga_{(1-x)}Fe_x)_2yO_3$, wherein $0.10 \leq x \leq 0.40$ and $0.8 \leq y \leq 1.2$, and wherein the mixed crystal has a beta-gallia structure.

<2> The gallium oxide-based semiconductor according to item <1>, wherein the half width of an X-ray diffraction peak derived from the beta-gallia structure is 1° or less.

<3> The gallium oxide-based semiconductor according to item <1> or <2>, wherein x is $0.10 \leq x \leq 0.30$.

<4> The gallium oxide-based semiconductor according to any one of items <1> to <3>, wherein y is 1.0.

<5> A method for producing the gallium oxide-based semiconductor according to item <1>, including:
depositing a mixed crystal having a composition represented by $(Ga_{(1-x)}Fe_x)_2yO_3$, wherein $0.10 \leq x \leq 0.40$ and $0.85 \leq y \leq 1.2$, on a substrate surface by a pulsed laser deposition method, and
wherein denoting the temperature of the substrate as T° C., x and T satisfy the relationship represented by $500x + 800 \leq T < 1,000$.

<6> The method for producing the gallium oxide-based semiconductor according to item <5>, wherein x and T satisfy the relationship represented by $500x + 800 \leq T \leq 950$.

<7> The method for producing the gallium oxide-based semiconductor according to item <5> or <6>, wherein the laser used in the pulsed laser deposition method is a pulsed ultraviolet laser.

<8> The method for producing the gallium oxide-based semiconductor according to any one of items <5> to <7>, wherein x is $0.10 \leq x \leq 0.30$.

<9> The method for producing the gallium oxide-based semiconductor according to any one of items <5> to <8>, wherein y is 1.0.

Advantageous Effects of Invention

According to the present disclosure, the mixed crystal is deposited at a predetermined substrate temperature by using a pulsed laser deposition method, so that even if gallium is replaced by a relatively large amount of iron, a gallium oxide-based semiconductor maintaining the beta-gallia structure, with its bandgap being sufficiently reduced, and a production method thereof can be provided.

DESCRIPTION OF EMBODIMENTS

Figure 1:
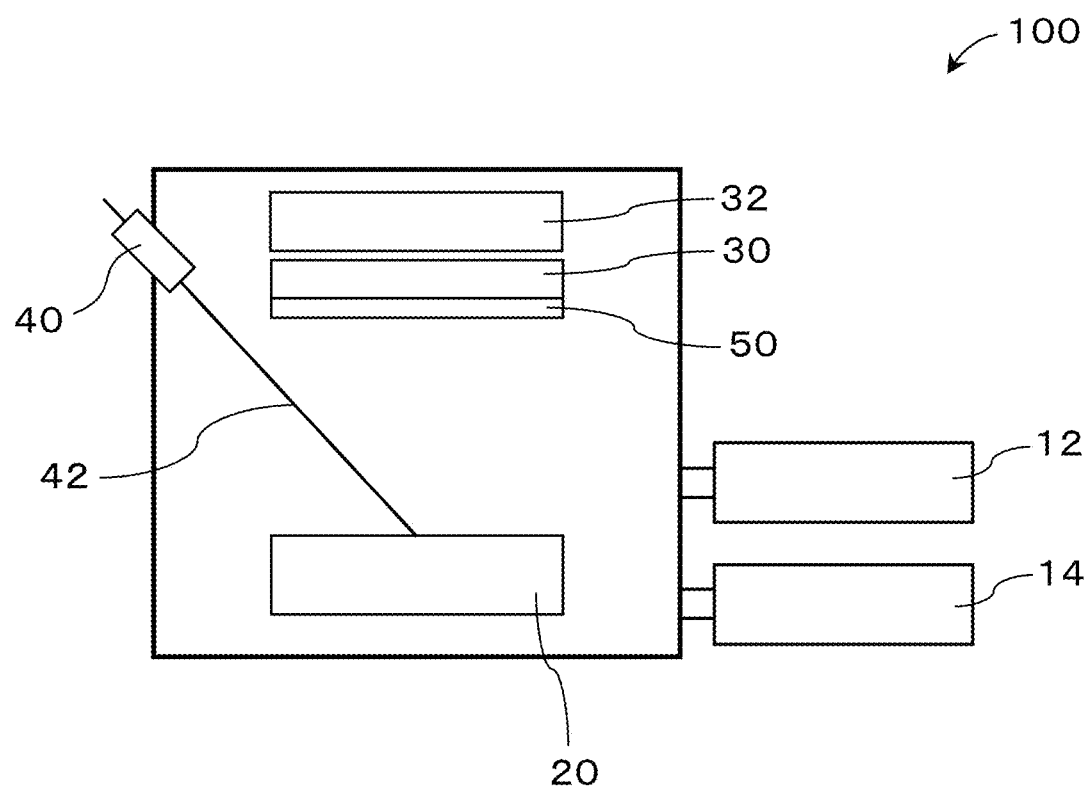
FIG. 1 is an explanatory diagram schematically illustrating the pulsed laser deposition method used in the production method of the gallium oxide-based semiconductor of the present disclosure.

The embodiments of the gallium oxide-based semiconductor of the present disclosure and a production method thereof are described in detail below. Note that the embodiments described below do not limit the gallium oxide-based semiconductor of the present disclosure and a production method thereof.

In the pulsed laser deposition method, it has conventionally been considered advantageous to deposit an object by setting the substrate temperature at 500 to 750° C. Even within the above-described range of the substrate temperature, if the substrate temperature reaches 600° C. or more, desorption of atoms deposited on the substrate is promoted, and in turn, the deposition rate rapidly drops. Accordingly, it has been considered more advantageous to deposit an object by setting the substrate temperature to a low temperature range of 500 to 600° C.

However, in the case of depositing gallium oxide ($Ga_2O_3$), when the crystal is deposited in a low temperature range of 500 to 600° C., it is difficult to suppress generation of a metastable phase ($\alpha$-$Ga_2O_3$) having a corundum structure, as a result, a most stable phase ($\beta$-$Ga_2O_3$) having a beta-gallia structure can hardly be obtained. Therefore, in the case of depositing gallium oxide ($\beta$-$Ga_2O_3$) having a beta-gallia structure, the crystal is deposited in a high temperature range of 650 to 750° C.

On the other hand, the bandgap of iron oxide ($Fe_2O_3$) is narrow, compared with gallium oxide ($Ga_2O_3$). This suggests that when gallium oxide ($Ga_2O_3$) and iron oxide ($Fe_2O_3$) are mixed and crystallized, i.e., when part of gallium in gallium oxide is replaced by iron and a mixed crystal is formed with it, the bandgap of a gallium oxide-based semiconductor can be reduced.

In the case of depositing a mixed crystal in which part of gallium in gallium oxide is replaced by iron, gallium oxide ($Ga_2O_3$) and iron oxide ($Fe_2O_3$) are used as targets. The most stable phase of gallium oxide ($Ga_2O_3$) has a monoclinic beta-gallia structure, and the most stable phase of iron oxide ($Fe_2O_3$) has a trigonal corundum structure. Accordingly, gallium oxide ($Ga_2O_3$) is accompanied by concern that even when deposited in a high temperature range of 650 to 750° C., it may be impossible for the mixed crystal to obtain a beta-gallia structure due to iron oxide ($Fe_2O_3$). There is also a concern about segregation of iron in the mixed crystal.

However, the present inventors have found that in practice, when the replacement ratio to iron (the blending ratio of the target iron oxide ($Fe_2O_3$)) is within a predetermined range, a phase having a beta-gallia structure can be deposited by raising, in a high temperature region exceeding 650 to 750° C., the substrate temperature in proportion as the replacement ratio to iron increases.

The constituent requirements of the gallium oxide-based semiconductor according to the present disclosure based on the finding above and a production method thereof are described below.

<<Gallium Oxide-Based Semiconductor>>

First, the constituent requirements of the gallium oxide-based semiconductor of the present disclosure are described.

<Composition of Mixed Crystal>

The gallium oxide-based semiconductor of the present disclosure contains a mixed crystal represented by $(Ga_{(1-x)}Fe_x)_{2y}O_3$. In this mixed crystal, part of gallium of gallium oxide ($Ga_2O_3$) is replaced by iron to form a solid solution of iron in gallium oxide ($Ga_2O_3$).

The replacement ratio to iron is represented by x and satisfies $0.1 \leq x \leq 0.4$. When x is 0.1 or more, the bandgap can be reduced by a desired amount relative to gallium oxide ($Ga_2O_3$). From this point of view, x is preferably 0.15 or more, more preferably 0.20 or more. The desired reduction amount is from 1 to 2 eV.

On the other hand, when x is 0.40 or less, a phase having a beta-gallia structure can be obtained. From this point of view, x is preferably 0.35 or less, more preferably 0.30 or less.

The gallium oxide-based semiconductor of the present disclosure contains a mixed crystal having a composition represented typically by $(Ga_{(1-x)}Fe_x)_{2y}O_3$ (y=1.0), i.e., $(Ga_{(1-x)}Fe_x)_2O_3$, but the mixed crystal may be a mixed crystal having a composition outside of y=1.0 within the range of $0.8 \leq y \leq 1.2$. In the gallium oxide semiconductor of the present disclosure, ideally, all mixed crystals have a composition represented by $(Ga_{(1-x)}Fe_x)_2O_3$. However, a mixed crystal whose composition is not $(Ga_{(1-x)}Fe_x)_2O_3$ may be partially contained. From this point of view, y may be 0.85 or more, 0.90 or more, or 0.95 or more, and may be 1.15 or less, 1.10 or less, or 1.05 or less.

The gallium oxide-based semiconductor of the present disclosure may contain trace elements, etc., in addition to the above-described mixed crystals. The trace elements typically include dopants.

The n-type dopant includes tin (Sn), titanium (Ti), zirconium (Zr), hafnium (Hf), vanadium (V), niobium (Nb), tantalum (Ta), molybdenum (Mo), tungsten (W), ruthenium (Ru), rhodium (Rh), iridium (Ir), carbon (C), silicon (Si), germanium (Ge), manganese (Mn), arsenic (As), antimony (Sb), bismuth (Bi), fluorine (F), chlorine (Cl), bromine (Br), and iodine (I), etc. Some of these may also be used in combination.

The p-type dopant includes magnesium (Mg), hydrogen (H), lithium (Li), sodium (Na), potassium (K), rubidium (Rb), cesium (Cs), francium (Fr), beryllium (Be), calcium (Ca), strontium (Sr), barium (Ba), radium (Ra), manganese (Mn), iron (Fe), cobalt (Co), nickel (Ni), palladium (Pd), copper (Cu), silver (Ag), gold (Au), zinc (Zn), cadmium (Cd), mercury (Hg), thallium (Tl), nitrogen (N), phosphorus (P), etc. Some of these may also be used in combination.

Other than the above-described trace elements, the gallium oxide-based semiconductor may contain unavoidable impurities. The unavoidable impurity indicates an impurity that is unavoidably contained or causes a significant rise in the production cost for avoiding its inclusion, such as impurities contained in raw materials of the gallium oxide-based semiconductor of the present disclosure or impurities having mixed in during the production process. The impurities, etc. having mixed in during the production process encompass a substance incorporated to the extent of exerting substantially no influence on the properties of the gallium oxide-based semiconductor of the present disclosure in terms of production convenience.

The method for analyzing the composition of the gallium oxide-based semiconductor of the present disclosure is not particularly limited. Particularly, the composition of a mixed crystal in the gallium oxide-based semiconductor of the present disclosure can be analyzed, for example, by using an electron probe micro analyzer (EPMA). This enables analysis of the replacement ratio x to a component, particularly, to iron, of a mixed crystal.

<Crystal Structure of Mixed Crystal>

The mixed crystal in the gallium oxide-based semiconductor of the present disclosure has a beta-gallia structure. This allows the electrical conductivity, withstand voltage and stability thereof to be enhanced. The beta-gallia structure of the gallium oxide-based semiconductor of the present disclosure is equivalent to the crystal structure that the most stable phase ($\beta$-$Ga_2O_3$) of gallium oxide has.

The beta-gallia structure can be confirmed, for example, by analyzing the gallium oxide-based semiconductor of the present disclosure by X-ray diffraction. The half width of an X-ray diffraction peak derived from the beta-gallia structure of the gallium oxide-based semiconductor of the present invention is preferably 1° or less. In this case, the amount of crystal lattice defects of the beta-gallia structure in the gallium oxide-based semiconductor of the present disclosure is reduced, and the electrical conductivity, withstand voltage and stability thereof are further enhanced. From this point of view, the half width of the X-ray diffraction peak is preferably 0.8° or less, 0.6° or less, 0.4° or less, or 0.2° or less. On the other hand, although the amount of crystal lattice defects of the beta-gallia structure decreases as the half width of the X-ray diffraction peak is smaller, even if the amount of crystal lattice defects is not zero, there is no practical problem. From this point of view, the half width of the X-ray diffraction peak may be 0.1° or more.

<<Production Method>>

Next, the method for producing the gallium oxide-based semiconductor of the present disclosure is described. The method for production the gallium oxide-based semiconductor of the present disclosure includes a deposition step. The deposition step is described below.

<Deposition Step>

A mixed crystal having a composition represented by $(Ga_{(1-x)}Fe_x)_{2y}O_3$, wherein $0.10 \leq x \leq 0.40$ and $0.8 \leq y \leq 1.2$, is deposited on a substrate surface by a pulsed laser deposition method to obtain the gallium oxide semiconductor of the present disclosure. This is described by referring to the drawing.

FIG. 1 is an explanatory diagram schematically illustrating the pulsed laser deposition method used in the production method of the gallium oxide-based semiconductor of the present disclosure.

The production method of the gallium oxide-based semiconductor of the present disclosure uses, for example, a pulsed laser deposition apparatus 100 illustrated in FIG. 1. The pulsed laser deposition apparatus 100 includes a vacuum chamber 10. To the vacuum chamber 10, an atmospheric gas introduction device 12 and a vacuum evacuation device 14 are connected.

Inside the vacuum chamber 10, a target 20, a substrate 30, and a laser inlet 40 are provided. The target 20 and the substrate 30 are facing each other. On the substrate 30 surface not facing the target 20, a substrate heating device 32 is provided. A pulsed laser 42 emitted from a pulsed laser oscillator (not shown) is introduced inside the vacuum chamber 10 through the laser inlet 40.

In the production method of the gallium oxide-based semiconductor of the present disclosure, the target 20 is irradiated with the pulsed laser 42 introduced through the laser inlet 40 to evaporate or sublimate (ablation) part of the target 20. In addition, the substrate 30 is heated by the substrate heating device 32. Then, a substance evaporated or sublimated (ablation) deposits on the surface of the substrate 30. This deposit is the gallium oxide-based semiconductor 50.

As long as a gallium oxide-based semiconductor containing a mixed crystal having a composition represented by $(Ga_{(1-x)}Fe_x)_{2y}O_3$, wherein $0.10 \leq x \leq 0.40$ and $0.8 \leq y \leq 1.2$, is obtained, the target 20 is not particularly limited. Typically, a compacted and sintered body of a mixed powder of a gallium oxide ($Ga_2O_3$) powder and an iron oxide ($Fe_2O_3$) powder is used. The gallium oxide ($Ga_2O_3$) powder and the iron oxide ($Fe_2O_3$) powder are blended such that the replacement ratio x to iron of the mixed crystal in the gallium oxide-based semiconductor becomes a desired value.

The type of the pulsed laser 42 is not particularly limited. For the reason that a high output is obtained, a pulsed ultraviolet laser is preferred. As the laser oscillator, an inert gas excimer laser oscillator, a halogen gas laser oscillator, etc. can be used. Typically, an argon gas excimer laser oscillator, an argon fluorine excimer laser oscillator, etc. can be used.

When the target 20 is irradiated with the pulsed laser 42, gallium atoms, iron atoms and oxygen atoms are released into the vacuum chamber 10 from gallium oxide ($Ga_2O_3$) and iron oxide ($Fe_2O_3$) in the target 20. At this time, an oxygen gas is preferably supplied from the atmospheric gas introduction device 12 into the vacuum chamber 10 so that gallium atoms and iron atoms can be unfailingly oxidized and deposited.

As the substrate 30, a substrate enabling deposition of gallium oxide ($\beta$-$Ga_2O_3$) having a beta-gallia structure can be used. Such a substrate includes, for example, $\beta$-$Ga_2O_3$, (0001) plane $\alpha$-$Al_2O_3$, and c-plane sapphire, etc. In view of consistency between the crystal structure of the substrate and the crystal structure of the film, a $\beta$-$Ga_2O_3$ is preferred. In view of discrimination between information from the substrate and information from the film at the time of inspecting the composition and crystal structure of the film after the deposition, a (0001) plane α-Al$_2$O$_3$ substrate is preferred.

As described above, the substrate 30 is heated during deposition. When the substrate temperature T is 600° C. or more, a crystalline gallium oxide-based semiconductor can be deposited. On the other hand, when the substrate temperature T is 1,000° C. or less, desorption of many of constituent elements from the deposited gallium oxide-based semiconductor can be suppressed, so that a significant decrease in the deposition rate can be prevented. Moreover, when the relationship between the replacement ratio x to iron and the substrate temperature T satisfies 0.10≤x≤0.40 and 500x+800≤T<1,000, the mixed crystal in the deposited gallium oxide-based semiconductor has a beta-gallia structure. Furthermore, when the relationship between the replacement ratio x to iron and the substrate temperature T satisfies 0.10≤x≤0.30 and 500x+800≤T≤950, at the time of analyzing the deposited gallium oxide-base semiconductor by X-ray diffraction, the half width of a peak derived from the beta-gallia structure is found to be 1° or less. That is, a beta-gallia structure with fewer crystal lattice defects can be obtained. From this point of view, in the formula above, T may satisfy (500x+800) or more and be 930 or less, 900 or less, 870 or less, or 850 or less.

Modification

Other than those described hereinabove, in the gallium oxide-based semiconductor of the present disclosure and the production method thereof, various modifications can made within the scope of contents set forth in claims. As described above, the gallium oxide-based semiconductor of the present disclosure is deposited on a substrate. The gallium oxide-based semiconductor of the present disclosure may be used in the state of being still on the substrate or may be used after removing the substrate. In the case of using the gallium oxide-based semiconductor after removing the substrate, a substrate removal step is added to the production method of the gallium oxide-based semiconductor of the present disclosure. As the method for removing the substrate, a well-known method, for example, polishing or lapping, may be applied.

EXAMPLES

The gallium oxide-based semiconductor of the present disclosure and the production method thereof are described more specifically below by referring to Examples and Comparative Examples. Note that the gallium oxide-based semiconductor of the present disclosure and the production method thereof are not limited to the conditions employed in the following Examples.

Preparation of Sample

Using the pulsed laser deposition apparatus 100 illustrated in FIG. 1, samples of Examples 1 to 6 and Comparative Examples 1 to 7 were prepared according to the following procedure.

Preparation of Sample of Example 1

A target 20 and a substrate 30 were placed within a vacuum chamber 10, and the interior of the vacuum chamber 10 was vacuumized by means of a vacuum evacuation device 14. An oxygen gas was supplied inside the vacuum chamber 10 from an atmospheric gas introduction device 12. The flow rate of the oxygen gas was 0.6 sccm, and the pressure inside the vacuum chamber 10 was 0.8 Pa.

The substrate 30 was heated at 850° C. (substrate temperature T is 850° C.) using a substrate heating device 32. The target 20 was irradiated with a pulsed laser 42, and a gallium oxide-based semiconductor 50 was deposited on the heated substrate 30.

As for the substrate 30, α-Al$_2$O$_3$ was used, and the deposition plane was (0001). A pulsed ultraviolet laser was used as the pulsed laser 42, and an argon fluorine excimer laser oscillator was used as the pulsed laser oscillator. A compacted and sintered body of a mixed powder of a gallium oxide (Ga$_2$O$_3$) powder and an iron oxide (Fe$_2$O$_3$) powder was used as the target 20. The gallium oxide (Ga$_2$O$_3$) powder and the iron oxide (Fe$_2$O$_3$) powder were blended such that the replacement ratio x to iron becomes 0.10.

Preparation of Sample of Example 2

The sample of Example 2 was prepared in the same manner as in Example 1 other than the substrate temperature T was 900° C. and the replacement ratio x to iron was 0.20.

Preparation of Sample of Example 3

The sample of Example 3 was prepared in the same manner as in Example 1 other than the substrate temperature T was 950° C. and the replacement ratio x to iron was 0.30.

Preparation of Sample of Example 4

The sample of Example 4 was prepared in the same manner as in Example 1 other than the substrate temperature T was 900° C.

Preparation of Sample of Example 5

The sample of Example 5 was prepared in the same manner as in Example 1 other than the substrate temperature T was 950° C.

Preparation of Sample of Example 6

The sample of Example 6 was prepared in the same manner as in Example 2 other than the substrate temperature T was 950° C.

Preparation of Sample of Comparative Example 1

The sample of Comparative Example 1 was prepared in the same manner as in Example 2 other than the substrate temperature T was 750° C.

Preparation of Sample of Comparative Example 2

The sample of Comparative Example 2 was prepared in the same manner as in Example 2 other than the substrate temperature T was 850° C.

Preparation of Sample of Comparative Example 3

The sample of Comparative Example 3 was prepared in the same manner as in Example 1 other than the substrate temperature T was 950° C. and the replacement ratio x to iron was 0.40.

Preparation of Sample of Comparative Example 4

The sample of Comparative Example 4 was prepared in the same manner as in Example 1 other than the substrate temperature T was 800° C.

Preparation of Sample of Comparative Example 5

The sample of Comparative Example 5 was prepared in the same manner as in Example 2 other than the substrate temperature T was 650° C.

Preparation of Sample of Comparative Example 6

The sample of Comparative Example 6 was prepared in the same manner as in Example 2 other than the substrate temperature T was 800° C.

Preparation of Sample of Comparative Example 7

The sample of Comparative Example 7 was prepared in the same manner as in Comparative Example 3 other than the substrate temperature T was 900° C.

Evaluation

With respect to each sample, X-ray diffraction analysis was performed. In addition, with respect to the samples of Examples 1 to 3 and Comparative Example 3, the bandgap was evaluated (measured). The bandgap was evaluated by measuring the light transmittance. Specifically, the sample was irradiated with light differing in the energy, and the transmittance of light was measured. Since only light having a smaller energy than the bandgap passes (transmits) through the sample, the bandgap was determined based on the energy dependency of the transmittance.

Figure 2:
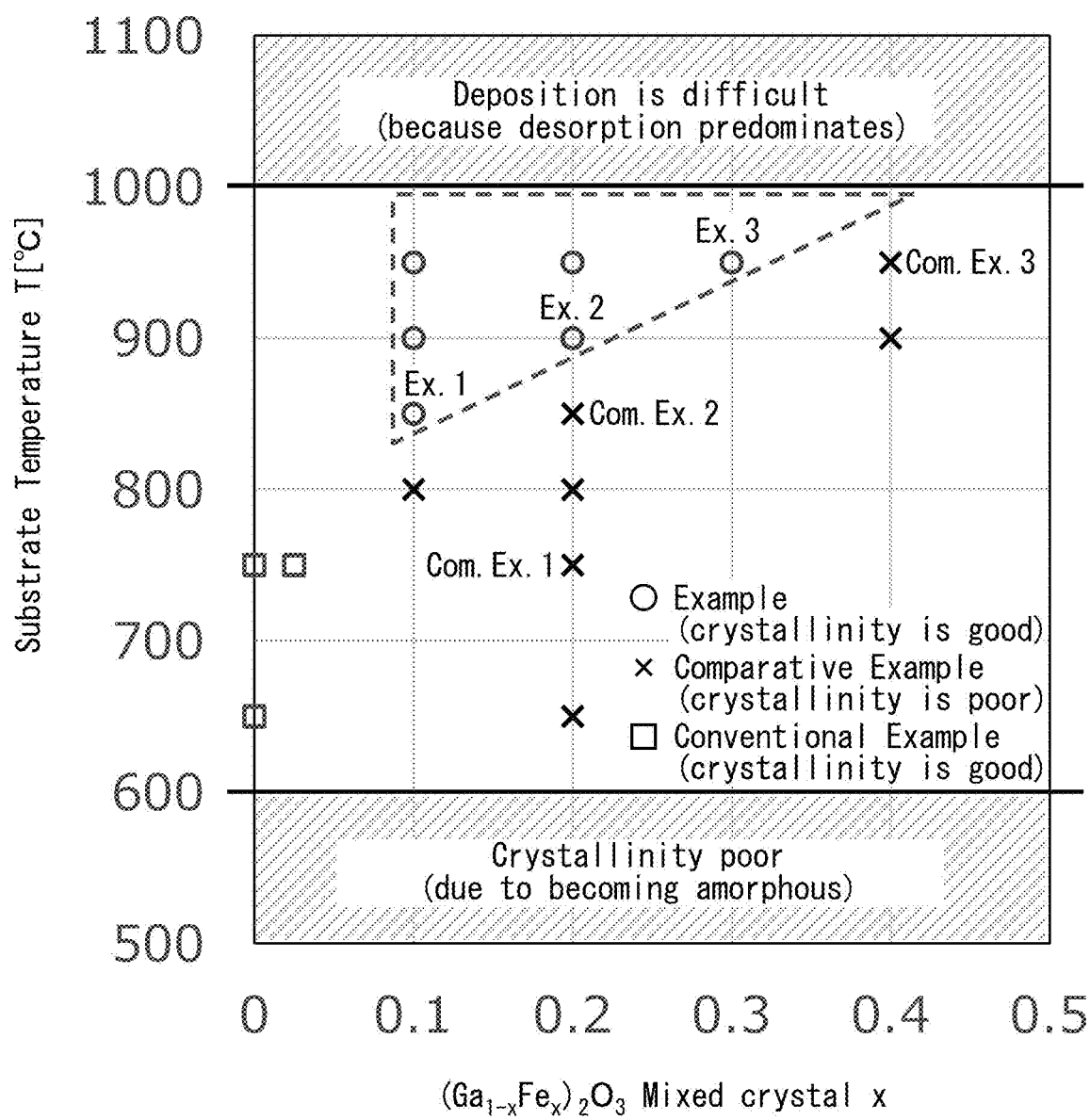
FIG. 2 is a graph illustrating the relationship among the composition of the mixed crystal in the gallium oxide-based semiconductor, the substrate temperature, and the crystallinity.

FIG. 2 illustrates the results. In FIG. 2, samples where as a result of X-ray diffraction analysis, a peak of a beta-gallia structure appeared and the half width of the peak was 1° or less is indicated by a circle mark as Example having good crystallinity, and samples where a peak of a beta-gallia structure did not appear is indicated by a cross mark as Comparative Example having poor crystallinity. Furthermore, the results described in Non-Patent Literature 1 are indicated by a square mark as Conventional Example.

Figure 3:
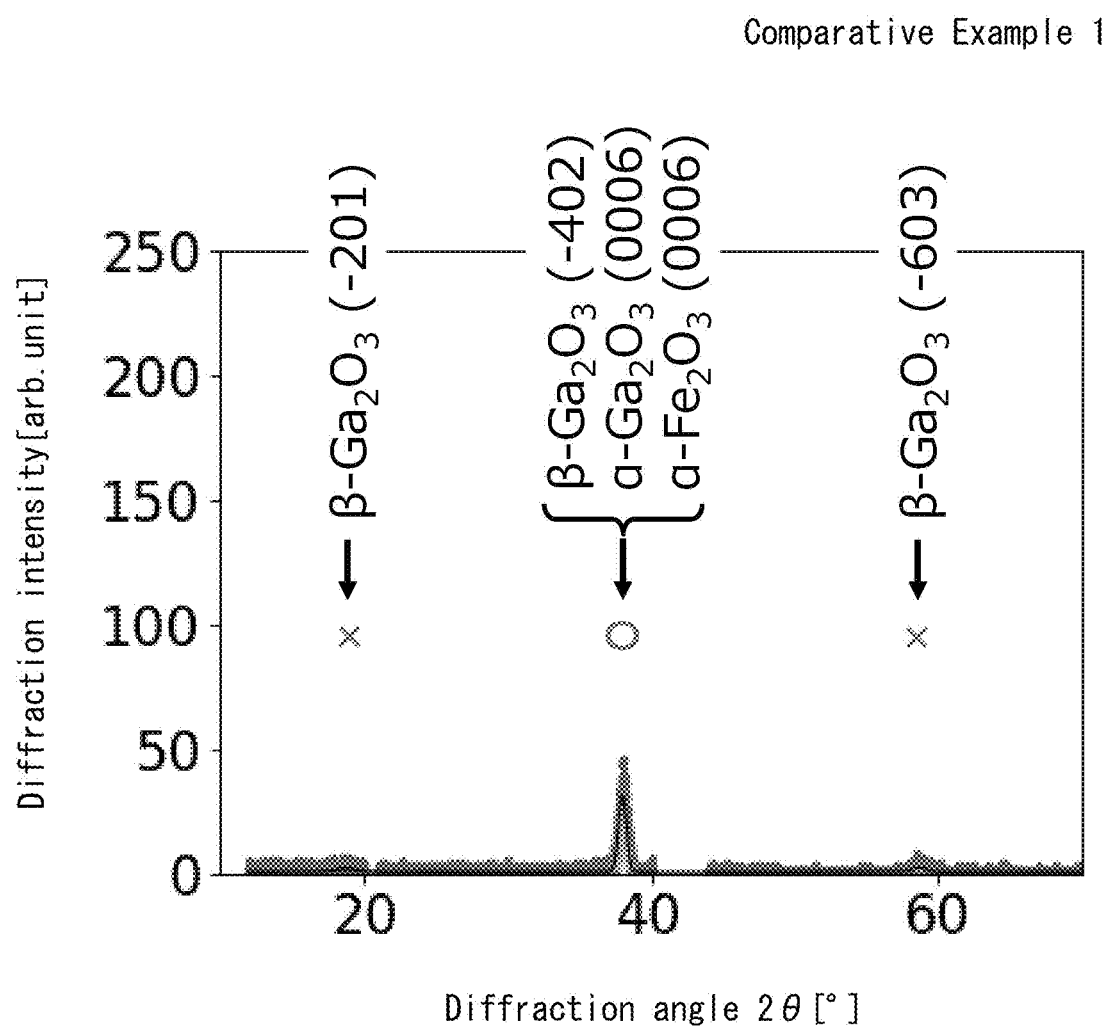
FIG. 3 is a diagram illustrating the X-ray diffraction pattern of the sample of Comparative Example 1.
Figure 4:
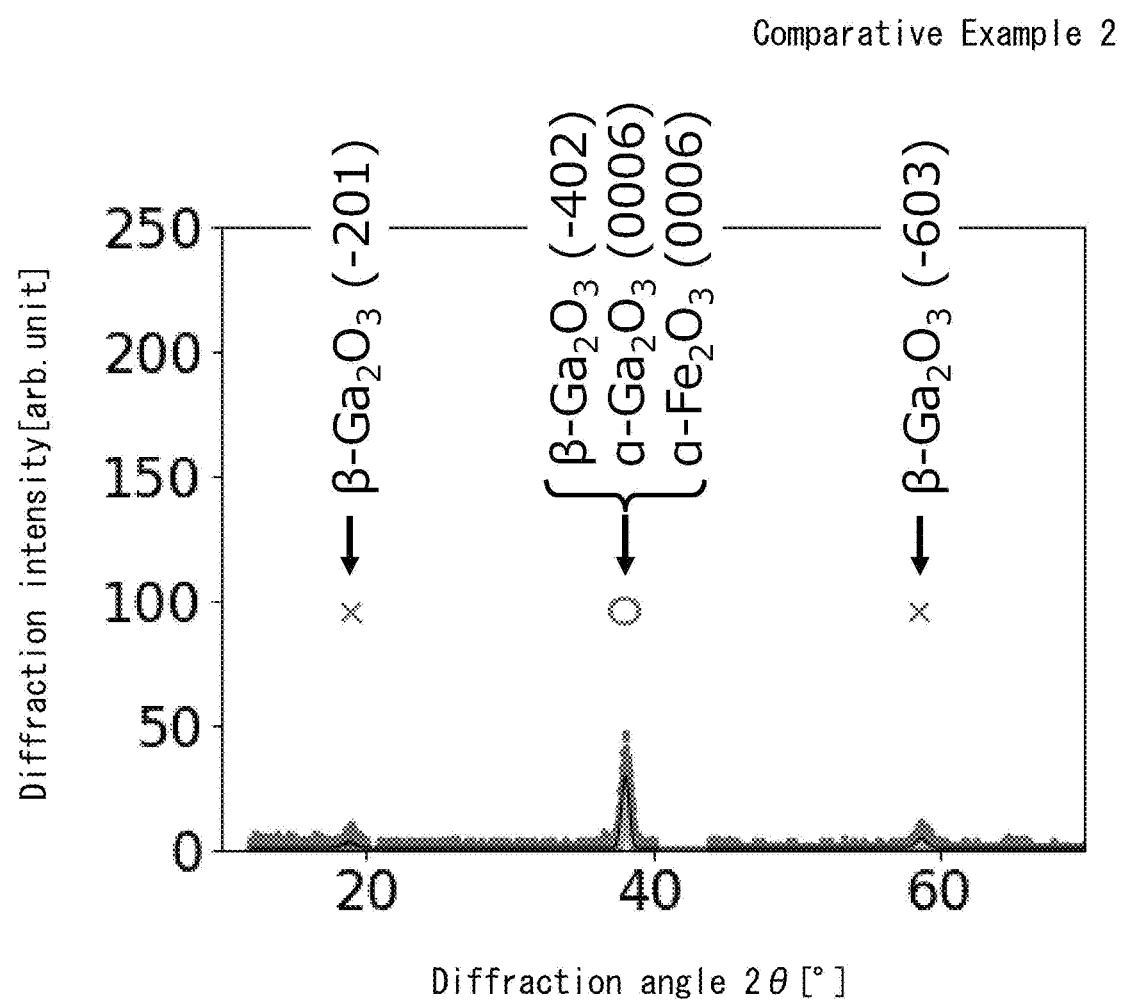
FIG. 4 is a diagram illustrating the X-ray diffraction pattern of the sample of Comparative Example 2.
Figure 5:
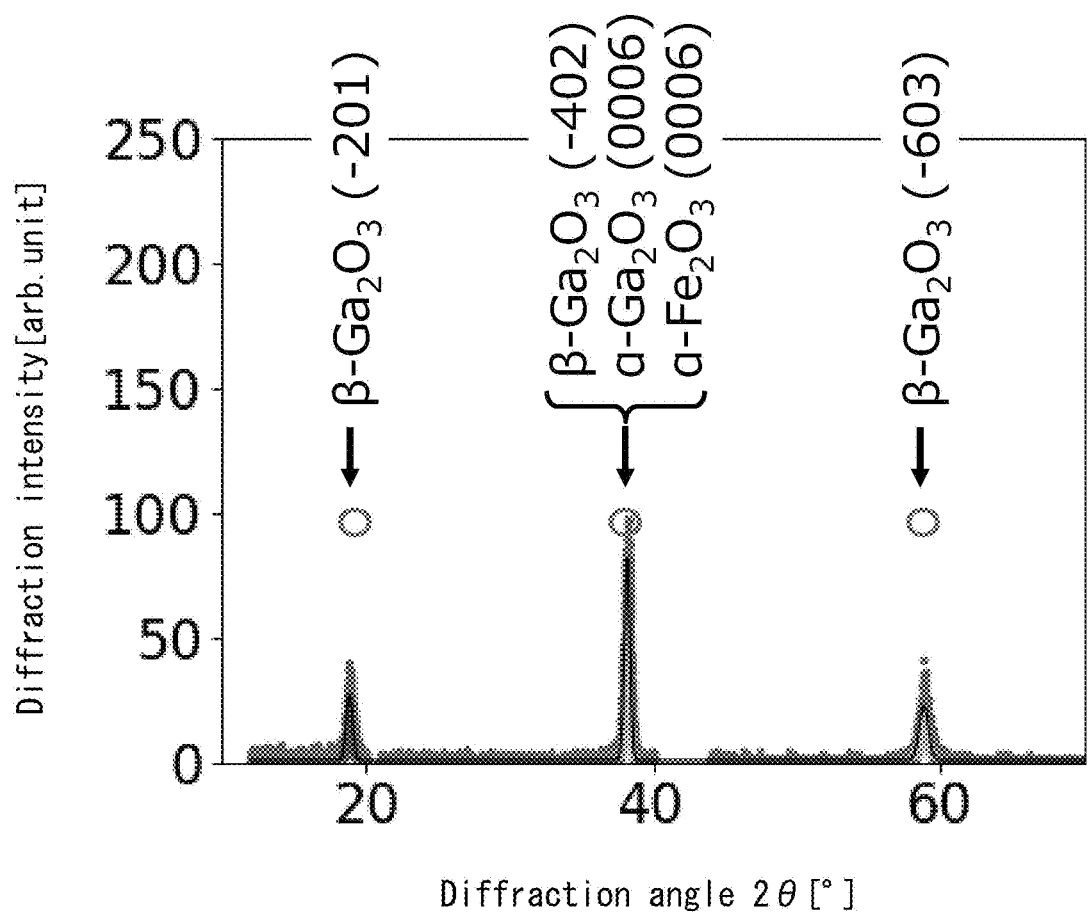
FIG. 5 is a diagram illustrating the X-ray diffraction pattern of the sample of Example 1.
Figure 6:
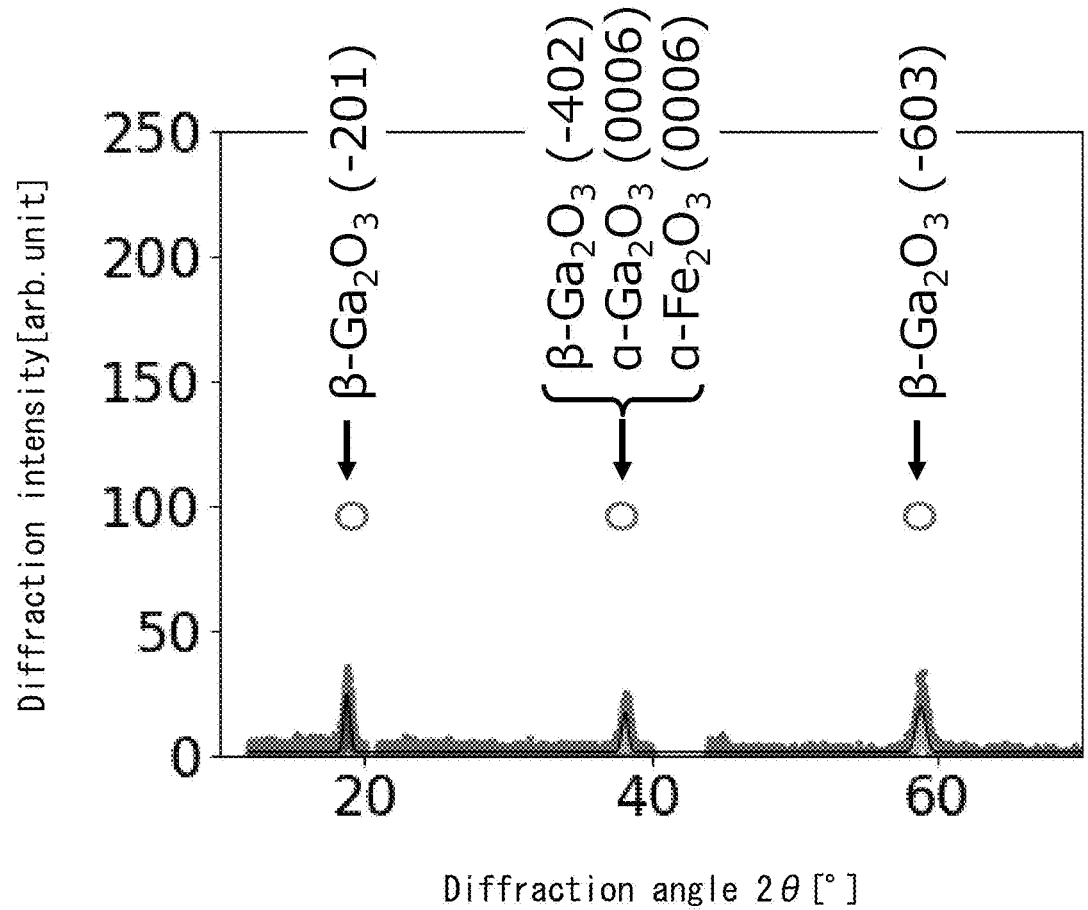
FIG. 6 is a diagram illustrating the X-ray diffraction pattern of the sample of Example 2.
Figure 7:
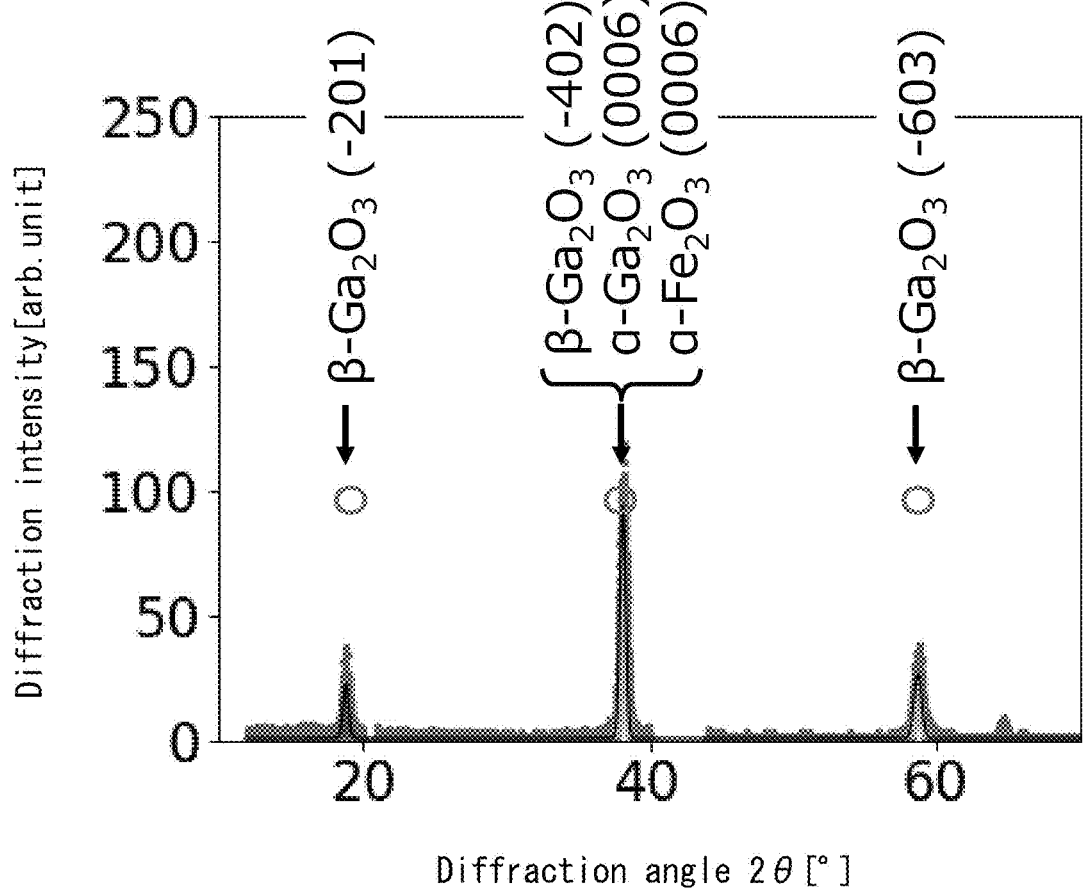
FIG. 7 is a diagram illustrating the X-ray diffraction pattern of the sample of Example 3.
Figure 8:
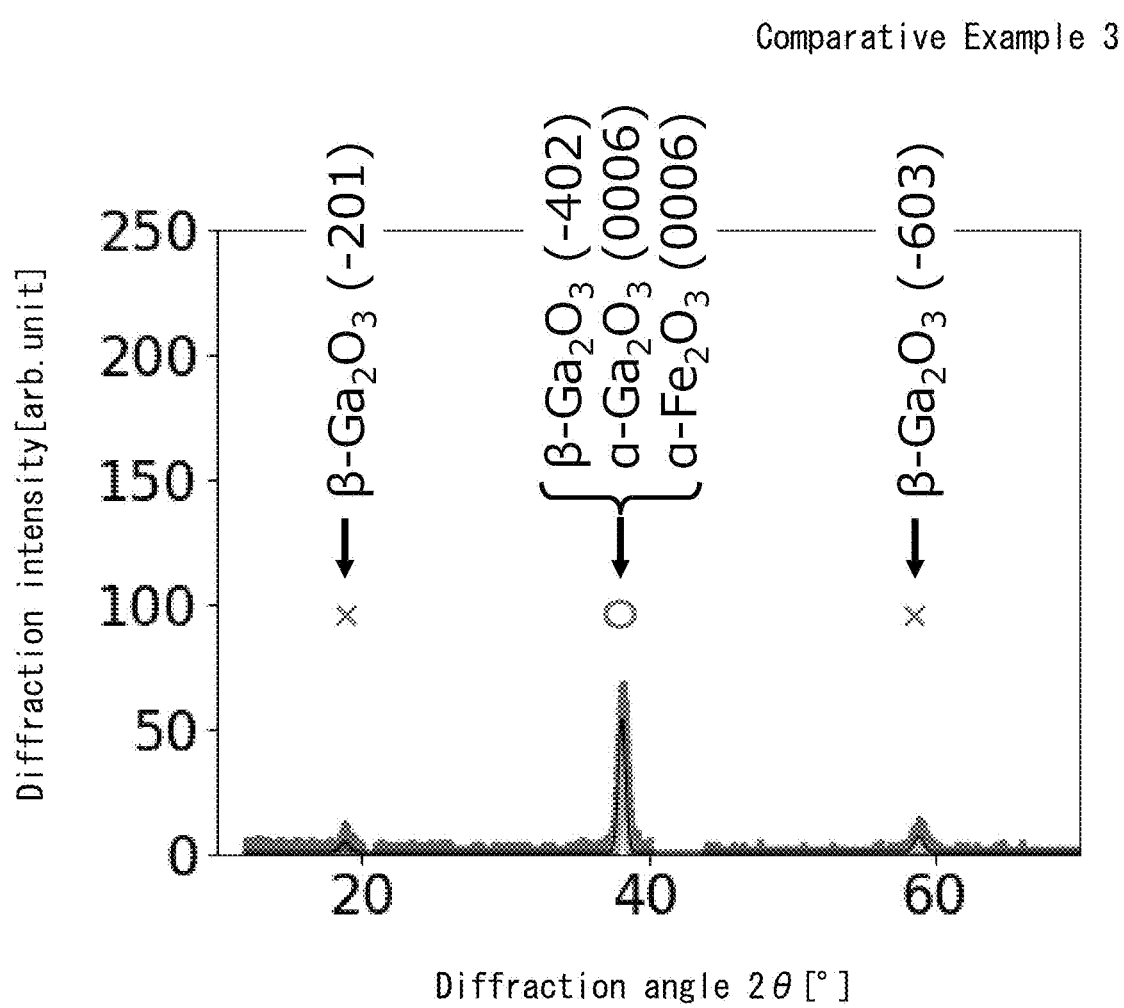
FIG. 8 is a diagram illustrating the X-ray diffraction pattern of the sample of Comparative Example 3.
Figure 9:
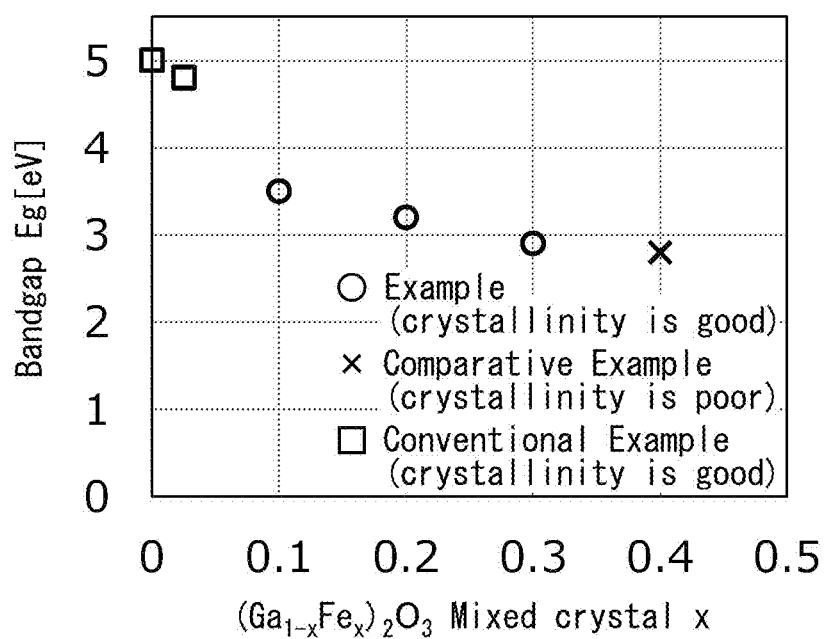
FIG. 9 is a graph illustrating the relationship between the composition of the mixed crystal in the gallium oxide-based semiconductor and the bandgap.

In addition, FIG. 3 is a diagram illustrating the X-ray diffraction pattern of the sample of Comparative Example 1. FIG. 4 is a diagram illustrating the X-ray diffraction pattern of the sample of Comparative Example 2. FIG. 5 is a diagram illustrating the X-ray diffraction pattern of the sample of Example 1. FIG. 6 is a diagram illustrating the X-ray diffraction pattern of the sample of Example 2. FIG. 7 is a diagram illustrating the X-ray diffraction pattern of the sample of Example 3. FIG. 8 is a diagram illustrating the X-ray diffraction pattern of the sample of Comparative Example 3. FIG. 9 is a graph illustrating the relationship between the composition of the mixed crystal in the gallium oxide-based semiconductor and the bandgap.

As seen from FIG. 3 to FIG. 9, it could be confirmed that gallium oxide-based semiconductors of the samples of Examples 1 to 6 satisfying $500x+800 \leq T < 1{,}000$ have a desired beta-gallia structure. Also, it could be confirmed from FIG. 3 and FIG. 10 that in a gallium oxide-based semiconductor having a beta-gallia structure, when the replacement ratio x to iron is from 0.1 to 04, the bandgap is sufficiently reduced.

These results could confirm the effects of the gallium oxide-based semiconductor of the present disclosure and the production method thereof.

REFERENCE SIGNS LIST

10 Vacuum chamber
12 Atmospheric gas introduction device
14 Vacuum evacuation device
20 Target
30 Substrate
40 Laser inlet
50 Gallium oxide-based semiconductor
100 Pulsed laser deposition apparatus

The invention claimed is:

1. A method for producing the gallium oxide-based semiconductor comprising a mixed crystal having a composition represented by $(Ga_{(1-x)}Fe_x)_{2y}O_3$, wherein $0.10 \leq x \leq 0.30$ and $0.8 \leq y \leq 1.2$, and wherein the mixed crystal has a beta-gallia structure, the method comprising:
    depositing a mixed crystal having a composition represented by $(Ga_{(1-x)}Fe_x)_{2y}O_3$, wherein $0.10 \leq x \leq 0.30$ and $0.8 \leq y \leq 1.2$, on a substrate surface by a pulsed laser deposition method, and
    wherein denoting a temperature of the substrate as T in degrees C., x and T satisfy a relationship represented by $500x+800 \leq T \leq 950$.

2. The method for producing the gallium oxide-based semiconductor according to claim 1, wherein the laser used in the pulsed laser deposition method is a pulsed ultraviolet laser.

3. The method for producing the gallium oxide-based semiconductor according to claim 1, wherein y is 1.0.

* * * * *